(12) United States Patent
Hiroi

(10) Patent No.: US 7,839,636 B2
(45) Date of Patent: Nov. 23, 2010

(54) IMAGE PROCESSING APPARATUS, FAN CONTROL METHOD, AND ENERGY-SAVING CONTROL DEVICE

(75) Inventor: Takaaki Hiroi, Tokyo (JP)

(73) Assignee: Ricoh Company, Limited, Tokyo (JP)

(*) Notice: Subject to any disclaimer, the term of this patent is extended or adjusted under 35 U.S.C. 154(b) by 113 days.

(21) Appl. No.: 12/207,793

(22) Filed: Sep. 10, 2008

(65) Prior Publication Data
US 2009/0073653 A1 Mar. 19, 2009

(30) Foreign Application Priority Data
Sep. 14, 2007 (JP) ............... 2007-239539
Aug. 21, 2008 (JP) ............... 2008-213299

(51) Int. Cl.
H05K 7/20 (2006.01)
G05D 23/01 (2006.01)

(52) U.S. Cl. .................. 361/695; 361/694; 700/300

(58) Field of Classification Search ............ 361/694, 361/695; 700/300
See application file for complete search history.

(56) References Cited

U.S. PATENT DOCUMENTS 5,680,294 A * 10/1997 Stora et al. .............. 361/695
6,472,828 B1 * 10/2002 Pruett et al. .............. 315/225
6,526,333 B1 * 2/2003 Henderson et al. ........ 700/300
6,709,111 B2 * 3/2004 Hirao et al. ............... 353/52
6,977,812 B2 * 12/2005 Sasaki ..................... 361/679.48
7,040,762 B2 * 5/2006 Yasuda .................... 353/52
7,303,318 B2 * 12/2007 Wang et al. ............... 362/345
7,606,640 B2 * 10/2009 Hirai et al. ............... 700/300
7,648,245 B2 * 1/2010 Park et al. ................ 353/52
2004/0239887 A1 * 12/2004 Yasuda .................... 353/57
2005/0240316 A1 * 10/2005 Mayer ..................... 700/300
2006/0097675 A1 * 5/2006 Hsu ........................ 318/280
2008/0231811 A1 * 9/2008 Nabeta .................... 353/57
2008/0296009 A1 * 12/2008 Ziarnik et al. ............ 165/287
2009/0136242 A1 * 5/2009 Okamoto et al. ......... 399/13
2010/0008037 A1 * 1/2010 Tuma ...................... 361/679.48

FOREIGN PATENT DOCUMENTS

JP 2004-163628 6/2004

* cited by examiner

*Primary Examiner*—Anatoly Vortman
(74) *Attorney, Agent, or Firm*—Oblon, Spivak, McClelland, Maier & Neustadt, L.L.P.

(57) ABSTRACT

An image processing apparatus includes an image processing unit, a main control unit, a fan, a fan control unit, and an energy-saving control unit. The energy-saving control unit includes a fan-rotation maintaining unit that maintains rotation of the fan for a predetermined time after the operating state of the image processing apparatus is shifted to the energy-saving state, and then turns off the power supply to the fan control unit.

9 Claims, 11 Drawing Sheets

WHEN ROTATION OF FAN IS CONTINUED

WHEN ROTATION OF FAN IS CANCELED

FIG. 7

|  | COPY | FAX | PRINTER | SCANNER |
|---|---|---|---|---|
| LOAD LIGHT 1 | ○ | | | |
| LOAD LIGHT 2 | | ○ | | |
| LOAD MEDIUM 1 | | | ○ | |
| LOAD MEDIUM 2 | | | | ○ |
| LOAD HEAVY | | | ○ | ○ |

# IMAGE PROCESSING APPARATUS, FAN CONTROL METHOD, AND ENERGY-SAVING CONTROL DEVICE

CROSS-REFERENCE TO RELATED APPLICATIONS

The present application claims priority to and incorporates by reference the entire contents of Japanese priority document 2007-239539 filed in Japan on Sep. 14, 2007 and Japanese priority document 2008-213299 filed in Japan on Aug. 21, 2008.

BACKGROUND OF THE INVENTION

1. Field of the Invention

The present invention relates to a technology for controlling a cooling unit that cools a heat-producing unit in an apparatus.

2. Description of the Related Art

In general, if a user does not operate an image processing apparatus, such as a printer, a copier, or a multifunction product (MFP), for a predetermined time, an operating state of the image processing apparatus is shifted to an energy-saving state. In the energy-saving state, the image processing apparatus causes some functions to be maintained in an operable state and the other functions to be stopped, and cuts off power for corresponding circuits to reduce the power consumption.

In recent years, the image processing apparatus includes a controller having a device with high processing performance, such as a central processing unit (CPU) and an application specific integrated circuit (ASIC), to achieve multiple functions with high performance. Because such a device generates a large amount of heat, if an appropriate cooling operation is not performed on the device, thermal runaway can occur in the device, resulting in a false operation or a breakdown of the device.

When the operating state of the image processing apparatus is shifted to the energy-saving state, the power is cut off for devices excluding some essential circuits such as a controller ASIC that monitors a factor (return factor) for returning to a normal operating state. Therefore, operations of a fan that exhausts high-temperature air from inside of a controller box that accommodates the controller (hereinafter, "case fan") and a fan that cools a substrate on which the CPU is mounted (hereinafter, "CPU fan") are stopped.

If the device and the controller box are overheated, a temperature of the device can exceed a limit of operating temperature of the device, causing thermal runaway in a currently-operating device.

To solve the above problem, Japanese Patent Application Laid-open No. 2004-163628 discloses an image forming apparatus that controls an operation of a fan that cools the image forming apparatus depending on an amount of operations performed by the image forming apparatus. A time at which the operating state is shifted to the energy-saving state in which the fan cannot be driven is changed based on the detected amount of operations. Specifically, if the amount of operations is large, a time during which the image forming apparatus is in a standby state to drive the fan is extended, so that the fan can be driven for a longer time.

With the method disclosed in Japanese Patent Application Laid-open No. 2004-163628, it is possible to prevent a situation where the fan cannot be driven due to the high temperature because the operating state is shifted to the energy-saving state even though the image forming apparatus is not sufficiently cooled down. However, because the method is based on an extended standby state where the power is still supplied to the controller and each processing unit for forming an image, the power is unnecessarily consumed and the energy-saving efficiency is degraded.

SUMMARY OF THE INVENTION

It is an object of the present invention to at least partially solve the problems in the conventional technology.

According to an aspect of the present invention, there is provided an image processing apparatus that includes an image processing unit that processes an image; a main control unit that controls the image processing unit; a fan for cooling the main control unit; a fan control unit that controls rotation of the fan independently of the main control unit; an energy-saving control unit that controls power supply to the main control unit and the fan control unit, and causes an operating state of the image processing apparatus to be shifted to an energy-saving state by turning off power supply to the main control unit; and a fan-rotation maintaining unit that maintains power supply to the fan control unit for a predetermined time even after the operating state of the image processing apparatus shifts to the energy-saving state thereby maintaining rotation of the fan for the predetermined time.

According to another aspect of the present invention, there is provided a fan control method to be performed by an image processing apparatus, the image processing apparatus including an image processing unit that processes an image; a main control unit that controls the image processing unit; a fan for cooling the main control unit; and a fan control unit that controls rotation of the fan independently of the main control unit, wherein the fan control method includes controlling power supply to the main control unit and the fan control unit, and causing an operating state of the image processing apparatus to be shifted to an energy-saving state by turning off power supply to the main control unit; and maintaining power supply to the fan control unit for a predetermined time even after the operating state of the image processing apparatus shifts to the energy-saving state thereby maintaining rotation of the fan for the predetermined time.

According to still another aspect of the present invention, there is provided an energy-saving control device for performing energy-saving control over an apparatus including a heat-producing member that produces heat, a fan that cools the heat-producing member, a first power-supply unit that supplies power to the heat-producing member, and a second power-supply unit that supplies power to the fan, wherein the energy-saving control device includes a control unit that, upon performing the energy-saving control, controls the first power-supply unit so as to cut power supply to the heat-producing member and controls the second power-supply unit so as to continue power supply to the fan for a predetermined time and then cut power supply to the fan.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is an example of a table containing a correspondence between amount of load on a CPU and image forming function in the image processing apparatus according to the first embodiment;

DETAILED DESCRIPTION OF THE PREFERRED EMBODIMENTS

Exemplary embodiments of the present invention are explained in detail below with reference to the accompanying drawings.

An image processing apparatus according to the embodiments includes an image input/output unit having a device that generates heat along with operation, such as a scanner or a print engine, and a main control unit having a CPU with high processing performance. Therefore, a temperature around the CPU increases due to the heat generated by the device and the CPU. As a result, a problem, such as deterioration or thermal runaway of the CPU, may occur in the image processing apparatus.

To prevent such a problem, the image processing apparatus includes a case fan that exhausts high-temperature air from a case that accommodates a circuit board included in the main control unit or the like, and a CPU fan that directly cools a circuit board on which a device, such as a CPU and an ASIC, is mounted.

The rotation of the case fan and the CPU fan is controlled such that a temperature of the device mounted on the circuit board does not exceed a standard value.

Figure 1:
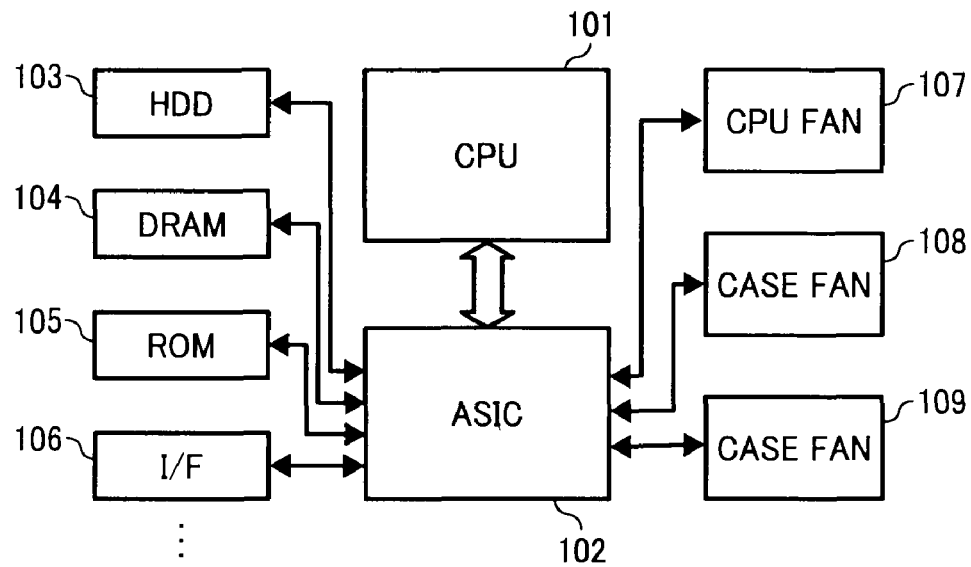
FIG. 1 is a block diagram for explaining a circuit configuration of a control unit in an image processing apparatus according to a first embodiment of the present invention.

FIG. 1 is a block diagram for explaining a circuit configuration of a control unit according to a first embodiment of the present invention. The main control unit including a CPU 101 and a control unit of a CPU fan 107, a case fan 108, and a case fan 109 (hereinafter, collectively referred to as "cooling fans" as appropriate) are mainly shown in FIG. 1, and other devices and operation units used for image processing are not shown.

The main control unit includes the CPU 101, an ASIC 102, and a group of storage devices including a hard disk drive (HDD) 103, a dynamic random access memory (DRAM) 104, a read only memory (ROM) 105, and a communication interface (I/F) 106. The storage devices are connected to the CPU 101 via the ASIC 102.

The main control unit integrally controls each operation unit (device) used for image processing in the image processing apparatus including a device and an operation unit that are not shown in FIG. 1.

The ROM 105 stores therein a computer program or the like to be used by the CPU 101 for performing an operation. The DRAM 104 is used as a work memory to store therein data generated during a process when the CPU 101 executes a computer program. The HDD 103 can store a large volume of data, and is used for storing therein image data and a computer program.

The CPU 101 controls an input/output operation of an image and various devices by an instruction received from an operation unit or a computer program that is automatically activated, and controls to maintain an appropriate operating state of the image processing apparatus. The cooling fans including the CPU fan 107, the case fan 108, and the case fan 109 that are connected to the CPU 101 via the ASIC 102 are also controlled by the CPU 101 (the main control unit) to maintain an appropriate operating state of the image processing apparatus.

The rotation of the cooling fans is turned on/off to prevent a temperature of the device such as the CPU 101 and the ASIC 102 mounted on the circuit board from exceeding a standard value due to heat generated during an operation performed by the device.

If a user does not operate the image processing apparatus for a predetermined time, the operating state of the image processing apparatus is shifted to an energy-saving state so that power consumption of the image processing apparatus is reduced. When the image processing apparatus is in the energy-saving state, some circuits, such as a controller ASIC that monitors a return factor for returning to a normal operating state, are maintained in an operable state. On the other hand, other functions are stopped and power supply to corresponding circuits is cut off, so that the power consumption is reduced.

Figure 2:
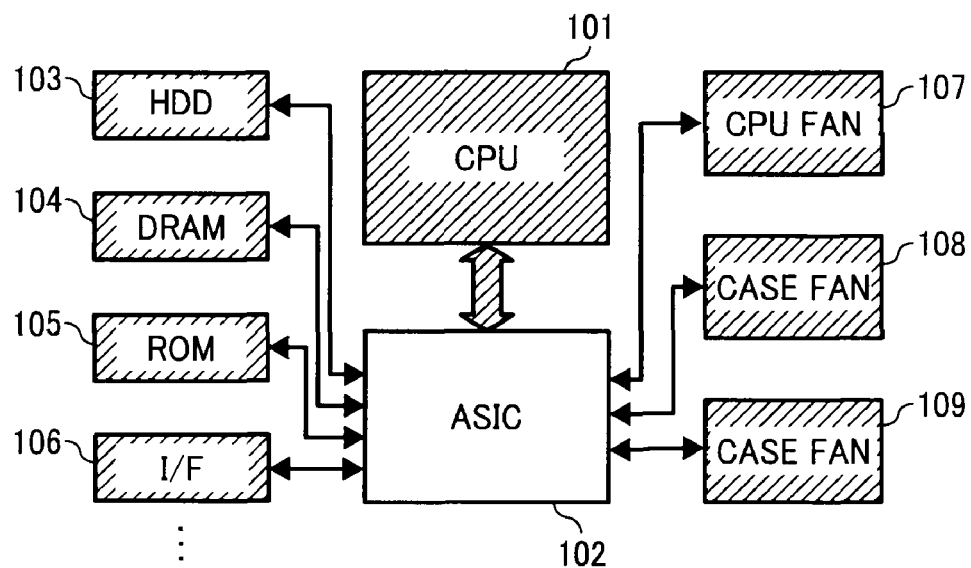
FIG. 2 is a block diagram for explaining a state in which power is supplied to an ASIC when the image processing apparatus according to the first embodiment is in an energy-saving state.

FIG. 2 is a block diagram for explaining a state in which power is supplied to the ASIC 102 when the image processing apparatus is in the energy-saving state. Although the power is supplied to the ASIC 102, the power is not supplied to the other circuit elements including the CPU 101 as indicated by hatching in FIG. 2. This means that the power is cut off for the circuit elements except for the ASIC 102 and some circuits (not shown), such as a sub CPU, that monitor a return factor and control the power supply so that the power consumption is reduced.

The power is supplied only to the ASIC 102 in the circuit shown in FIG. 2, because the ASIC 102 monitors a return factor and controls the power supply. In such a state, the cooling fans cannot be controlled by the CPU 101 because the cooling fans are controlled by the CPU only in the normal operating state in which the whole circuits are operable.

If the normal operating state is suddenly shifted to the energy-saving state shown in FIG. 2, and the rotation of the cooling fans is stopped, it is difficult to prevent a problem, such as deterioration or thermal runaway of the CPU 101, due to a high temperature as described above. Furthermore, if a timing of shifting to the energy-saving state is delayed to continue the rotation of the cooling fans, the power is unnecessarily consumed, and the energy-saving efficiency is degraded as described above.

To solve the above problems, in the first embodiment, the image processing apparatus includes a unit that continues the rotation of the cooling fans for a predetermined time after the operating state is shifted to the energy-saving state (hereinafter, "a fan-rotation maintaining unit").

The fan-rotation maintaining unit turns on the rotation of the cooling fan and continues the rotation of the cooling fan for a predetermined time after the operating state is shifted to the energy-saving state, i.e., without depending on the CPU 101 that controls the cooling fans in the normal operating state.

To perform such an operation, power is supplied to the cooling fan from a power line to which power supply is continued even in the energy-saving state, and the rotation of the cooling fan is continued for a predetermined time after the operating state is shifted to the energy-saving state by using the ASIC 102 and an additional circuit arranged in an input stage of a unit (fan control circuit) that causes the cooling fan to be turned on/off.

Because the image processing apparatus includes the fan-rotation maintaining unit, the rotation of the cooling fan can be continued after the operating state is shifted to the energy-saving state to prevent the high temperature of the device and inside the controller box without degrading the energy-saving efficiency.

Figure 3:
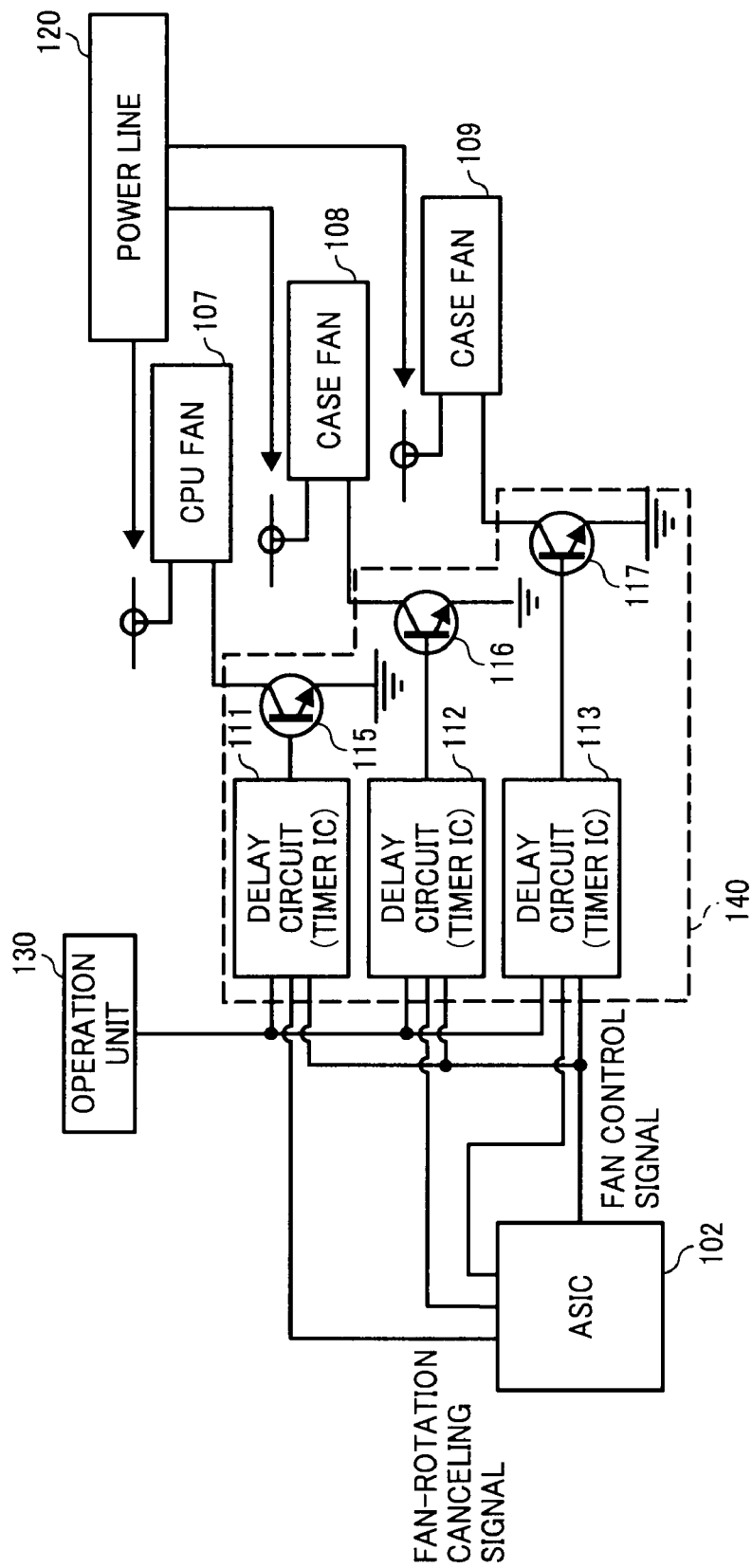
FIG. 3 is a circuit diagram of a fan control circuit in the image processing apparatus according to the first embodiment.

FIG. 3 is a circuit diagram of a fan control circuit according to the first embodiment. The fan control circuit is operated after the operating state is shifted to the energy-saving state. The fan control circuit includes an operation unit 130, the ASIC 102, a power line 120, and a fan-rotation maintaining unit 140. The power is not cut off to the power line 120 even when the image processing apparatus is in the energy-saving state. Although not shown in FIG. 3, the fan control circuit also includes the CPU 101.

The operation unit 130 receives inputs for various operations from a user, such as a reset input to forcibly stop the rotation of the CPU fan 107, the case fan 108, and the case fan 109 when the image processing apparatus is in the energy-saving state. The reset input is fed to the fan-rotation maintaining unit 140 as a reset signal.

The fan-rotation maintaining unit 140 controls the rotation of the CPU fan 107, the case fan 108, and the case fan 109. Each of the CPU fan 107, the case fan 108, and the case fan 109 is connected to the power line 120, and the rotation of each of the CPU fan 107, the case fan 108, and the case fan 109 is switched on/off by turning on/off the power from a power source to each of the CPU fan 107, the case fan 108, and the case fan 109.

The power to each of the CPU fan 107, the case fan 108, and the case fan 109 is turned on/off based on a level of an input signal fed to transistors 115, 116, and 117 that are connected to the CPU fan 107, the case fan 108, and the case fan 109, respectively. If the transistors 115, 116, and 117 are bipolar transistors, a base input voltage is the input signal, and if the transistors 115, 116, and 117 are field-effect transistors (FETs), a gate input voltage is the input signal.

When the operating state is shifted to the energy-saving state, the fan-rotation maintaining unit 140 turns on the rotation of the cooling fan, and continues the rotation of the cooling fan for a predetermined time in which it is assumed that the temperatures of the CPU 101 and the like become lower than the standard value.

The fan-rotation maintaining unit 140 includes delay circuits 111, 112, and 113 and the transistors 115, 116, and 117. The rotation of the cooling fan is switched on/off by turning on/off the power to the cooling fan. Therefore, each of the delay circuits 111, 112, and 113 receives, from the ASIC 102, an input for supplying the power from the power source, and delays cutting of power supply to the fan-rotation maintaining unit 140 for the predetermined time during which the rotation of the cooling fan is continued.

Because the delay circuits 111, 112, and 113 delays cutting of power supply to the fan-rotation maintaining unit 140, it is possible to continue the rotation of the cooling fan after the operating state is shifted to the energy-saving state by using logic or a capacitor having a relatively low capacity.

Furthermore, each of the delay circuits 111, 112, and 113 receives, from the ASIC 102, a fan control signal for continuing the rotation of the cooling fan and a fan-rotation canceling signal for canceling the rotation of the cooling fan, and a reset signal that is fed by reset input from the operation unit 130.

A circuit including a one-shot timer IC is used as each of the delay circuits 111, 112, and 113 to delays cutting of power supply.

Figure 4:
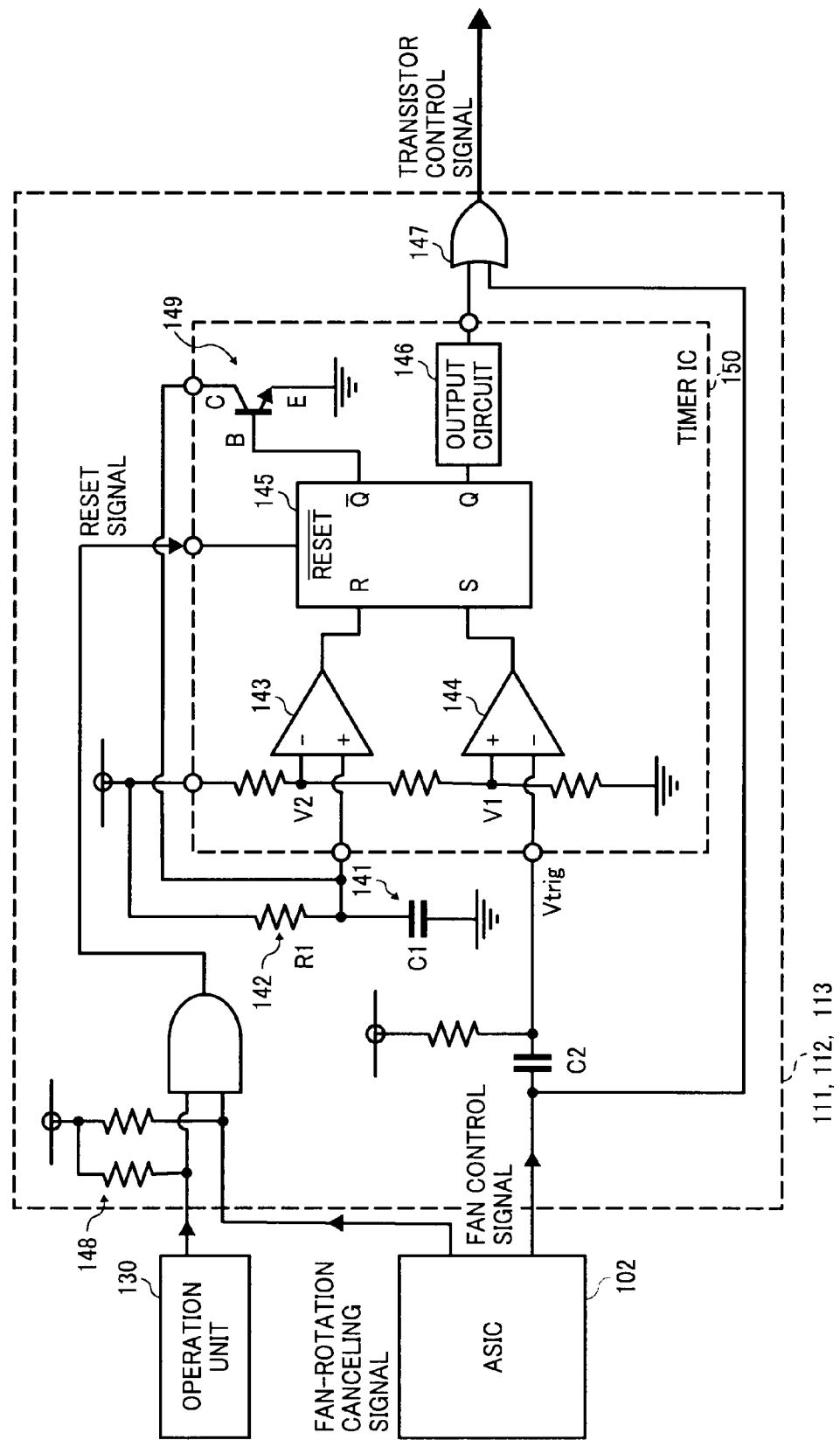
FIG. 4 is a circuit diagram for explaining a specific configuration of delay circuits in the image processing apparatus according to the first embodiment.

Each of the delay circuits 111, 112, and 113 has a simple configuration with a relatively small number of components. FIG. 4 is a circuit diagram for explaining a specific configuration of the delay circuits 111, 112, and 113. Each of the delay circuits 111, 112, and 113 includes a one-slot timer IC 150 (hereinafter, "timer IC 150"), a resistor 142, a capacitor 141, an OR circuit 147, and a pull-up resistor 148. The resistor 142 and the capacitor 141 are arranged outside the timer IC 150. The resistor 142 has resistance R1, and the capacitor 141 has capacitance C1.

The timer IC 150 functions as a one-shot timer IC. The timer IC 150 includes differential circuits 143 and 144, an RS-flip flop (RS-FF) 145, an output circuit 146, and a transistor 149.

When the image processing apparatus is in the energy-saving state, the fan control signal from the ASIC 102 is fed to the transistors 115, 116, and 117 as a transistor control signal through the delay circuits 111, 112, and 113.

Figure 5:
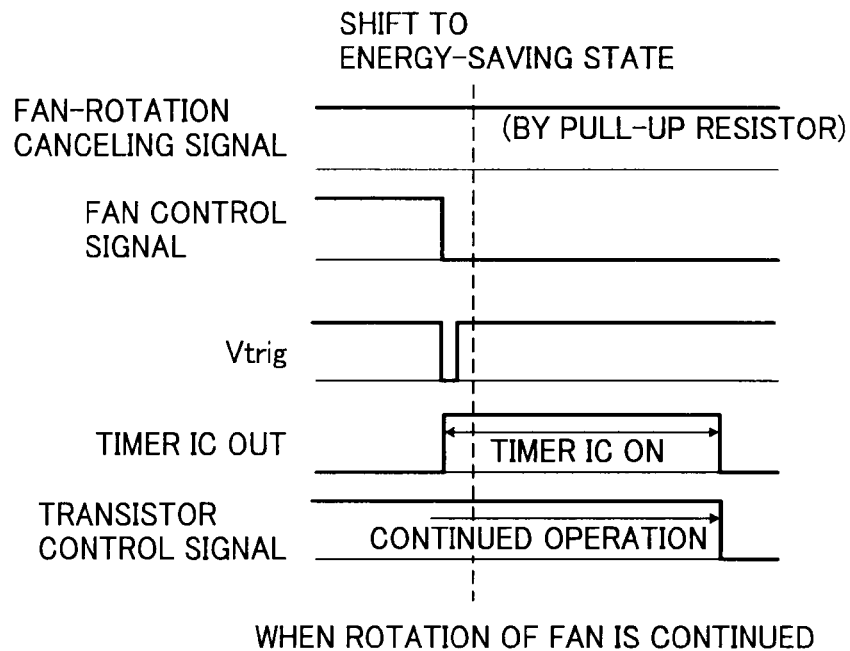
FIG. 5 is a timing chart for explaining levels of signals when rotation of a cooling fan is continued in the image processing apparatus according to the first embodiment.

Specifically, a signal output from the output circuit 146 is LOW by default. When the fan control signal fed to the delay circuits 111, 112, and 113 is LOW while the fan-rotation canceling signal is HIGH, a low pulse is input to Vtrig whereby a signal output from the output circuit 146 is HIGH for a predetermined time. As a result, the transistor control signal output from the OR circuit 147 is HIGH, so that the rotation of the cooling fan is continued. FIG. 5 is a timing chart for explaining levels of the fan-rotation canceling signal, the fan control signal, the Vtrig, the output signal from the timer IC 150, and the transistor control signal when the rotation of the cooling fan is continued.

Based on the resistance R1 and the capacitance C1, a delay time (a value of C1×R1) by which a timing of changing an output from the timer IC 150 is delayed is determined for an input trigger to the timer IC 150. The delay time can be set to any value by changing the values of the resistance R1 and the capacitance C1.

Figure 6:
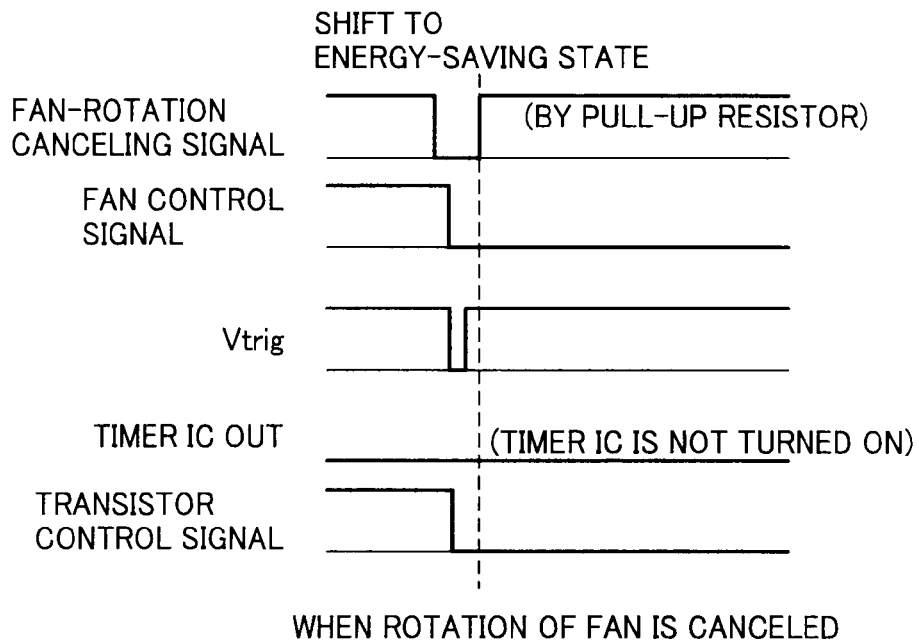
FIG. 6 is a timing chart for explaining levels of signals when the rotation of the cooling fan is canceled in the image processing apparatus according to the first embodiment.

Furthermore, when the reset input is fed from the operation unit 130 while the fan control signal is LOW, or when the fan control signal is set to LOW while the fan-rotation canceling signal from the ASIC 102 is LOW, the reset signal is input to the timer IC 150, and the RS-FF 145 causes the output circuit 146 to output a LOW signal. Thus, the transistor control signal output from the OR circuit 147 is LOW, so that the rotation of the cooling fan is canceled. That is, the rotation of the cooling fan that has continued in the energy-saving state is forcibly stopped. FIG. 6 is a timing chart for explaining levels of the fan-rotation canceling signal, the fan control signal, the Vtrig, the output signal from the timer IC 150, and the transistor control signal when the rotation of the cooling fan is canceled.

Specifically, if the ASIC 102 feeds the fan control signal as a trigger when the operating state is shifted to the energy-saving state, a control signal for supplying the power is continuously fed to the transistors 115, 116, and 117 for the delay time corresponding to the value of (C1×R1), so that the rotation of the cooling fans can be continued for a predetermined time after the operating state is shifted to the energy-saving state, and cooling capacity can be changed.

The values of the resistance R1 and the capacitance C1 (the value of C1×R1) are set such that the appropriate delay time can be obtained. If the image processing apparatus includes a high-performance CPU or a CPU with a high operation clock frequency thereby generating a large amount of heat, the values of the resistance R1 and the capacitance C1 are set such that a time during which the rotation of the cooling fan is continued (hereinafter, "rotation continuation time") is long. On the other hand, if the image processing apparatus includes a low-performance CPU or a CPU with a low operation clock frequency thereby generating a small amount of heat, the values of the resistance R1 and the capacitance C1 are set such that the rotation continuation time of the cooling fan is as short as possible. In this manner, it is possible to set the minimum rotation continuation time of the cooling fan, and achieve the energy saving.

As described above, because the timer IC 150 is used in each of the delay circuits 111, 112, and 113, a time at which the rotation of the cooling fan is stopped can be determined by the resistance R1 and the capacitance C1 in a relatively accurate manner. Furthermore, because the one-shot timer IC having a relatively simple configuration is used, it is possible to reduce costs.

As shown in FIG. 3, the fan-rotation maintaining unit 140 is provided for each of the CPU fan 107, the case fan 108, and the case fan 109.

If the rotation of the cooling fan is controlled with the above circuit configuration, when the operating state is shifted to the energy-saving state, the rotation of each of the cooling fans is controlled in accordance with cooling capacity required for an expected increase in a temperature instead of uniformly continuing the rotation of the cooling fans so that the appropriate operating state can be ensured.

This method is the same as the method of changing the delay time in terms of changing the cooling capacity. However, in the method of changing the delay time, although it is possible to change the delay time depending on performance of a different type of CPU by varying the value of (C×R), it is difficult to change the delay time depending on changes of the operating state of the CPU.

Therefore, in the first embodiment, the operating state of the CPU is monitored by the ASIC 102 serving as a monitoring unit, and if different cooling capacity is required depending on a load on the CPU 101, a variation of continuing the rotation of the cooling fans is selected from three variations. The three variations are a variation in which one of the three cooling fans is rotated, a variation in which two of the cooling fans are rotated in combination, and a variation in which all of the cooling fans are rotated. Thus, the cooling fans can be operated in an appropriate manner.

An amount of load on the CPU 101 is determined based on a currently executed function of forming an image. FIG. 7 is an example of a table for explaining a correspondence between amount of load on the CPU 101 and function of forming an image. The ROM 105 stores therein such a table.

The ASIC 102 determines a currently executed function of forming an image based on an operation input from the operation unit 130 or a state of process, refers to the table shown in FIG. 7, and determines the amount of load on the CPU 101 as monitoring of the amount of load on the CPU 101. If the currently executed function is a printer function, the ASIC 102 determines that the amount of load on the CPU 101 is load medium 1 or load heavy as shown in FIG. 7. The table shown in FIG. 7 is an example, and the present invention is not limited to that. For example, although two levels of the amount of load on the CPU 101 are set for each of the printer function and the scanner function, i.e., load medium 1 and load heavy for the printer function and load medium 2 and load heavy for the scanner function as shown in the table, it is possible to set one level of the amount of load for each of the functions in the table.

Although the ROM 105 stores therein the table shown in FIG. 7, the present invention is not limited to such a configuration. The relation between the amount of load on the CPU 101 and the function of forming an image can be determined from a processing flow of the currently executed function.

When the operating state is shifted to the energy-saving state, the variation of continuing the rotation of the cooling fan is selected based on the amount of load on the CPU 101 that is monitored for a predetermined time (in the first embodiment, five minutes) before the operating state is shifted to the energy-saving state, and the cooling fan to be rotated by the fan-rotation maintaining unit 140 is determined based on the selected variation.

Figure 8:
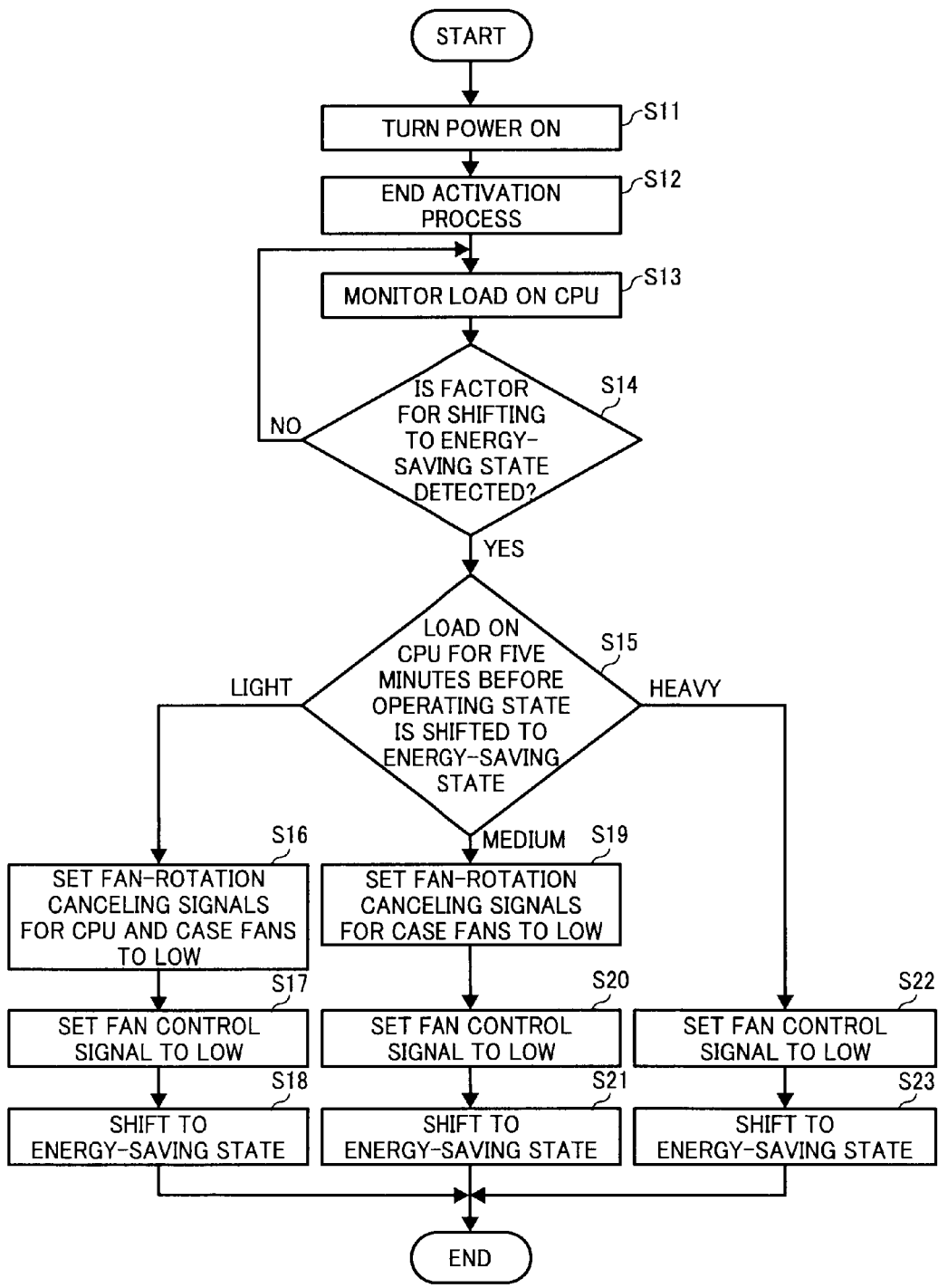
FIG. 8 is a flowchart for explaining operations performed by the image processing apparatus from turning on of a power source to shifting to the energy-saving state according to the first embodiment.

FIG. 8 is a flowchart for explaining operations performed by the image processing apparatus from turning on of the power source to shifting to the energy-saving state. When the power source of the image processing apparatus is turned on (Step S11), an activation process is performed. When the activation process ends (Step S12), the ASIC 102 monitors the load on the CPU 101 (Step S13). Specifically, as described above, the ASIC 102 regularly determines a function currently executed by the image processing apparatus for forming an image, refers to the table stored in the ROM 105, and determines the amount of load on the CPU 101. Then, the ASIC 102 enters a wait state for detecting a factor for shifting to the energy-saving state (No at Step S14).

When a factor for shifting to the energy-saving state is detected (Yes at Step S14), the amount of load on the CPU 101 for five minutes before the operating state is shifted to the energy-saving state is determined (Step S15). If the amount of load on the CPU 101 is heavy (load heavy in FIG. 7), the fan control signal is set to LOW while the fan-rotation canceling signals for all of the cooling fans are set to HIGH (Step S22). Then, the operating state is shifted to the energy-saving state (Step S23). In this manner, the rotation of the CPU fan 107, the case fan 108, and the case fan 109 are continued for the predetermined time after the operating state is shifted to the energy-saving state.

Figure 9A:
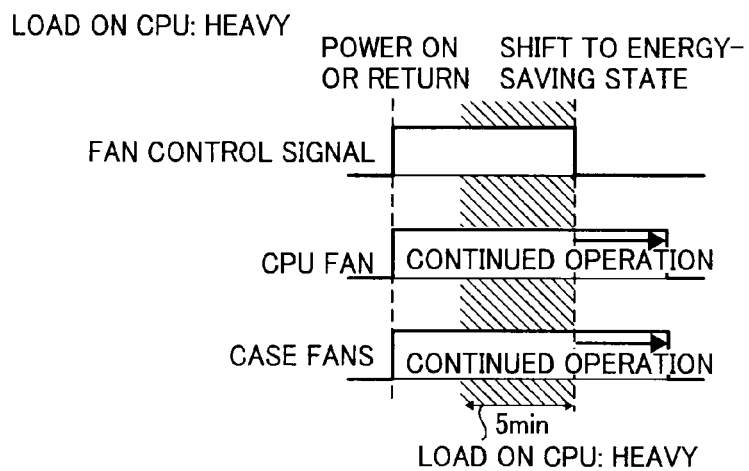
FIG. 9A is a timing chart for explaining a level of a fan control signal and rotating states of a CPU fan and case fans when the amount of load on the CPU is heavy just before the operating state is shifted to the energy-saving state in the image processing apparatus according to the first embodiment.

FIG. 9A is a timing chart for explaining a level of the fan control signal and the rotating states of the CPU fan 107, the case fan 108, and the case fan 109 if the amount of load on the CPU 101 is heavy just before the operating state is shifted to the energy-saving state. Before the operating state is shifted to the energy-saving state, the fan control signal is set to High, and therefore, the control signal for supplying the power is input from the ASIC 102 to each of the cooling fans so that the CPU fan 107, the case fan 108, and the case fan 109 are rotated.

If the amount of load on the CPU 101 is heavy for five minutes before the operating state is shifted to the energy-saving state, it is assumed that the temperature of the CPU 101 is high. Therefore, the variation in which all of the cooling fans including the CPU fan 107 are to be rotated by the fan-rotation maintaining unit 140 is selected, and a trigger is input to the one-shot timer IC of each of the cooling fans. Then, the control signal for supplying the power is continuously fed to the transistors 115, 116, and 117 for the delay time after the operating state is shifted to the energy-saving state, so that the rotation of the cooling fans are continued.

As shown in FIG. 8, if the amount of load on the CPU 101 is medium for five minutes before the operating state is shifted to the energy-saving state at Step S15 (load medium 1 and load medium 2 in FIG. 7), the fan-rotation canceling signals for the case fan 108 and the case fan 109 are set to LOW (Step S19), and the fan control signal is set to LOW (Step S20). Then, the operating state is shifted to the energy-saving state (Step S21). In this manner, the rotation of only the CPU fan 107 is continued for the predetermined time after the operating state is shifted to the energy-saving state, and the rotation of the case fan 108 and the case fan 109 are stopped.

Figure 9B:
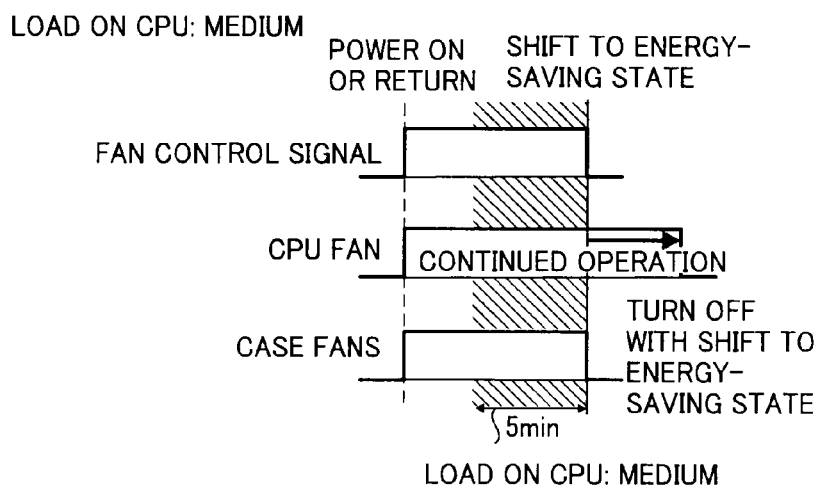
FIG. 9B is a timing chart for explaining a level of the fan control signal and the rotating states of the CPU fan and the case fans when the amount of load on the CPU is medium just before the operating state is shifted to the energy-saving state in the image processing apparatus according to the first embodiment.

FIG. 9B is a timing chart for explaining a level of the fan control signal and the rotating states of the CPU fan 107, the case fan 108, and the case fan 109 if the amount of load on the CPU 101 is medium just before the operating state is shifted to the energy-saving state.

If the amount of load on the CPU 101 is medium for five minutes before the operating state is shifted to the energy-saving state, it is assumed that the temperature of the CPU 101 is not high. Therefore, the rotation of the case fan 108 and the case fan 109 is stopped at the same time the operating state is shifted to the energy-saving state, because the case fan 108 and the case fan 109 are large cooling fans and cause noises if the rotation of the case fan 108 and the case fan 109 is continued in the energy-saving state.

On the other hand, because it is assumed that the temperature of the CPU 101 is not low enough, the variation in which the CPU fan 107 is to be rotated by the fan-rotation maintaining unit 140 is selected, and a trigger is input to the one-shot timer IC for the CPU fan 107. Then, the control signal for supplying the power is continuously input to the transistor 115 for the delay time after the operating state is shifted to the energy-saving state, so that the rotation of the CPU fan 107 is continued.

As shown in FIG. 8, if the amount of load on the CPU 101 is light for five minutes before the operating state is shifted to the energy-saving state at Step S15 (load light 1 and load light 2 in FIG. 7), the fan-rotation canceling signals for the CPU fan 107, the case fan 108, and the case fan 109 are set to LOW (Step S16), and the fan control signal is set to LOW (Step S17). Then, the operating state is shifted to the energy-saving state (Step S18). In this manner, the rotation of the CPU fan 107, the case fan 108, and the case fan 109 are stopped.

Figure 9C:
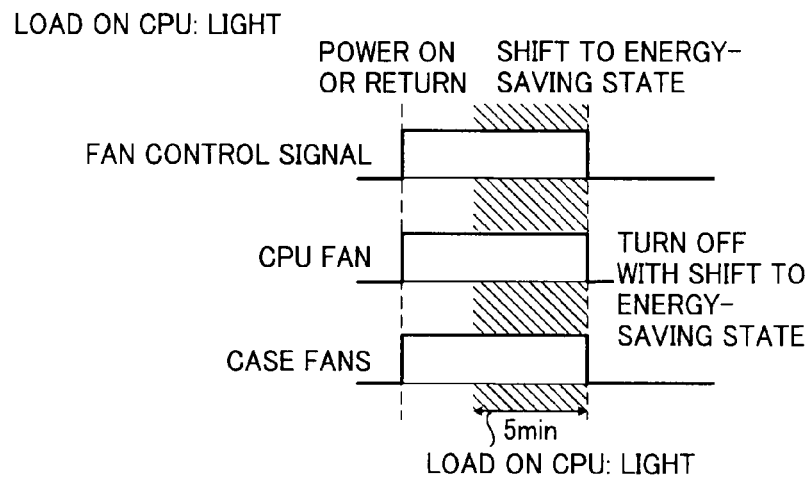
FIG. 9C is a timing chart for explaining a level of the fan control signal and the rotating states of the CPU fan and the case fans when the amount of load on the CPU is light just before the operating state is shifted to the energy-saving state in the image processing apparatus according to the first embodiment.

FIG. 9C is a timing chart for explaining a level of the fan control signal and the rotating states of the CPU fan 107, the case fan 108, and the case fan 109 if the amount of load on the CPU 101 is light just before the operating state is shifted to the energy-saving state.

If the load on the CPU 101 is light for five minutes before the operating state is shifted to the energy-saving state, it is assumed that the temperature of the CPU 101 is low. Therefore, the rotation of all of the cooling fans is stopped at the same time the operating state is shifted to the energy-saving state.

It is explained above that the circuit shown in FIG. 3 is operated after the operating state is shifted to the energy-saving state. However, if turning on/off of the power to the cooling fans is controlled by the operation of the transistors 115, 116, and 117 via the ASIC 102 in the normal operation in which the main control unit can be operated, the delay circuits 111, 112, and 113 are not necessary during the normal operation. Therefore, each of the delay circuits 111, 112, and 113 needs to be disabled during the normal operation, and be enabled when the image processing apparatus is in the energy-saving state.

As described above, when the operating state is shifted to the energy-saving state, the rotation of the cooling fans is continued for the predetermined time after the operating state is shifted to the energy-saving state. Therefore, deterioration and thermal runaway of the device can be prevented. Thus, it is possible to operate the cooling fans in an appropriate manner without degrading the energy-saving efficiency.

Furthermore, the variation of continuing the rotation of the cooling fans is selected based on the amount of load on the CPU 101 for five minutes before the operating state is shifted to the energy-saving state, and the unnecessary rotation of the cooling fan is stopped. Thus, it is possible to maintain the minimum power consumption, and to reduce noises after the operating state is shifted to the energy-saving state.

Although the circuit including the one-shot timer IC is used as the delay circuit to delays cutting of power supply in the first embodiment, a timer circuit is used as the delay circuit in which it is possible to variably set the delay time to continue the rotation of the cooling fan in a second embodiment of the present invention.

Figure 10:
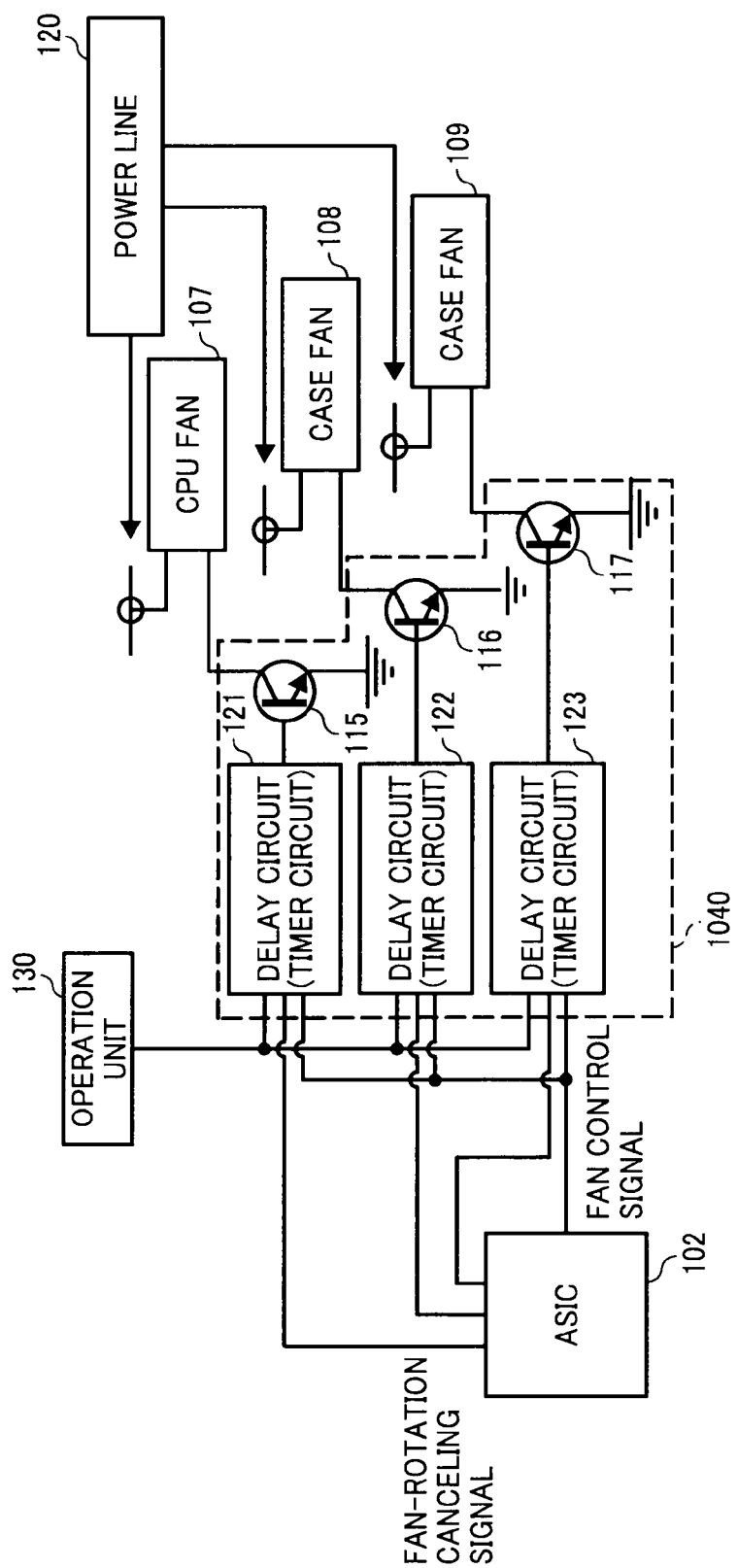
FIG. 10 is a circuit diagram of a fan control circuit in an image processing apparatus according to a second embodiment of the present invention.

FIG. 10 is a circuit diagram of a fan control circuit according to the second embodiment. The fan control circuit is operated after the operating state is shifted to the energy-saving state. The fan control circuit includes the operation unit 130, the ASIC 102, the power line 120, and a fan-rotation maintaining unit 1040. Although not shown in FIG. 10, the fan control circuit includes the CPU 101.

The fan-rotation maintaining unit 1040 controls the rotation of the CPU fan 107, the case fan 108, and the case fan 109 in the same manner as the fan-rotation maintaining unit 140 in the first embodiment. In the second embodiment, each of the CPU fan 107, the case fan 108, and the case fan 109 is connected to the power line 120, and the rotation of each of the CPU fan 107, the case fan 108, and the case fan 109 is switched on/off by turning on/off the power from the power source to each of the CPU fan 107, the case fan 108, and the case fan 109.

The fan-rotation maintaining unit 1040 includes delay circuits 121, 122, and 123 and the transistors 115, 116, and 117. The delay circuits 121, 122, and 123 are timer circuits. The transistors 115, 116, and 117 have the same configuration as those in the first embodiment.

The timer circuit can set the delay time during which the rotation of the cooling fan is continued after the operating state is shifted to the energy-saving state to any value, and can adapt to changes of the operating state of the CPU 101. Therefore, it is possible to solve a problem that is difficult to solve with the method of changing the delay time based on the values of the resistor and the capacitor with the external one-shot timer IC as described above.

When the image processing apparatus is in the energy-saving state, the fan control signal from the ASIC 102 is fed to the transistors 115, 116, and 117 as the transistor control signal through the delay circuits 121, 122, and 123.

Specifically, if the ASIC 102 generates a LOW fan control signal as a trigger when the operating state is shifted to the energy-saving state, the control signal for supplying the power is continuously fed to the transistors 115, 116, and 117 for the delay time corresponding to the time set by the delay circuits 121, 122, and 123. Thus, the rotation of the cooling fan can be continued for the predetermined time after the operating state is shifted to the energy-saving state, and the cooling capacity can be changed.

Figure 11:
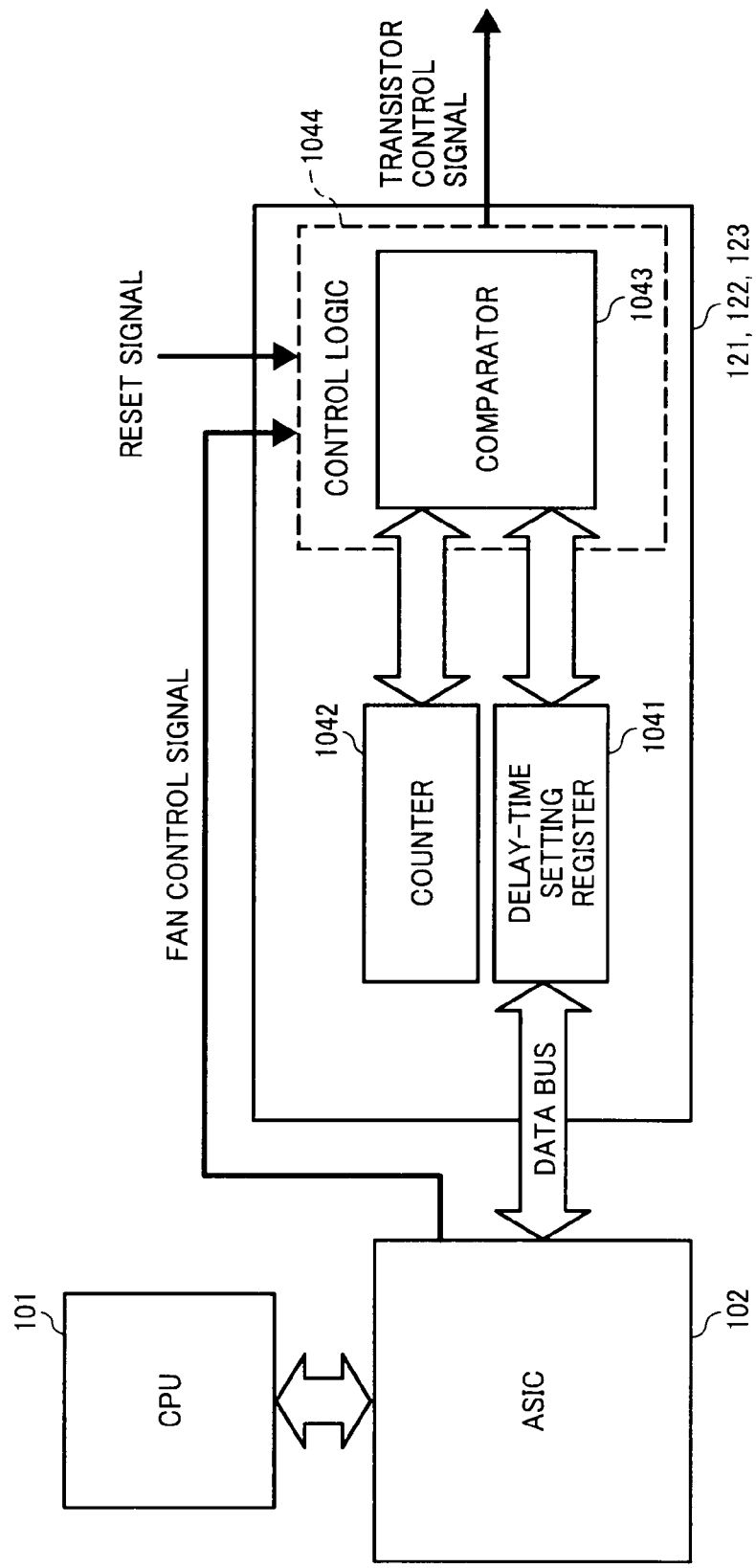
FIG. 11 is a circuit diagram for explaining a specific configuration of delay circuits in the image processing apparatus according to the second embodiment.

FIG. 11 is a circuit diagram for explaining a specific configuration of the delay circuits 121, 122, and 123. Each of the delay circuits 121, 122, and 123 includes a counter 1042, a delay-time setting register 1041, and a control logic 1044 including a comparator 1043.

A desired delay time is set in the delay-time setting register 1041 by the main control unit. The setting of the delay time in the delay-time setting register 1041 is performed by a procedure of changing the set value in accordance with an instruction from the main control unit when the operating state is shifted to the energy-saving state.

The control logic 1044 receives the fan control signal from the ASIC 102 and the reset signal from the operation unit 130. When the control logic 1044 receives the LOW fan control signal, the control logic 1044 instructs the counter 1042 to start counting an elapsed time from the time when the fan control signal is input. Thus, the counter 1042 counts the elapsed time in response to an instruction from the control logic 1044.

The comparator 1043 compares the elapsed time counted by the counter 1042 with the delay time set in the delay-time setting register 1041. If the elapsed time does not reach the delay time, the control logic 1044 feeds the HIGH transistor control signal to the transistors 115, 116, and 117. Thus, the rotation of the cooling fan is continued for the delay time after the operating state is shifted to the energy-saving state.

When the control logic 1044 receives the reset signal, the control logic 1044 causes the counter 1042 to stop counting the elapsed time, and feeds the LOW transistor control signal to the transistors 115, 116, and 117. Thus, the rotation of the cooling fan that has continued after the operating state is shifted to the energy-saving state is forcibly stopped.

Thus, because the delay time can be set to any value in the delay circuits 121, 122, and 123, the rotation continuation time of the cooling fan after the operating state is shifted to the energy-saving state can be controlled in an appropriate manner. However, it is possible that the cooling effect is not appropriately obtained by the set delay time depending on the status or environment of usage of the image processing apparatus.

For example, in some cases, even if the rotation continuation time of the cooling fan is short, the required cooling effect can be obtained, and a problem does not occur for an operation of the image processing apparatus. In such a case, there is a request from a user to prevent the unnecessary consumption of the power and noises caused by the operation of the cooling fan.

Therefore, in the same manner as in the first embodiment, after the operating state is shifted to the energy-saving state, the reset signal is fed from the operation unit 130 to the control logic 1044 before the rotation continuation time of the cooling fan is elapsed so that the rotation of the cooling fan is forcibly stopped.

As shown in FIG. 11, it is possible to continue the rotation of each of the CPU fan 107, the case fan 108, and the case fan 109 based on the delay time set in the delay-time setting register 1041.

To control the rotation of the cooling fans, when the operating state is shifted to the energy-saving state, the delay time is set by the delay circuits 121, 122, and 123 to continue the rotation of each of the cooling fans in accordance with cooling capacity required for an expected increase in a temperature instead of uniformly continuing the rotation of the cooling fans so that the appropriate operating state can be ensured.

This method is the same as the method in the first embodiment in changing the cooling capacity. However, as described with reference to FIG. 8, in the first embodiment, the cooling fan for which the rotation is to be continued is selected based on the operating state (the amount of load) of the CPU 101, resulting in limited adaptability.

On the other hand, in the second embodiment, if different cooling capacity is required depending on the operating state of the CPU 101, the cooling fan for which the rotation is to be continued is selected, and the rotation continuation time is set for each of the cooling fans. Thus, the variations of continuing the rotation of the cooling fan are enhanced, and the appropriate operation can be performed for each of the cooling fans.

In the second embodiment, the required cooling capacity can be assumed based on the amount of load on the CPU 101. The amount of load on the CPU 101 is monitored, and when the operating state is shifted to the energy-saving state, the variation of continuing the rotation of the cooling fans is selected based on the amount of load on the CPU 101 for the predetermined time (in the second embodiment, five minutes) before the operating state is shifted to the energy-saving state. Then, the cooling fan to be rotated by the fan-rotation maintaining unit 1040 is determined based on the selected variation.

Figure 12:
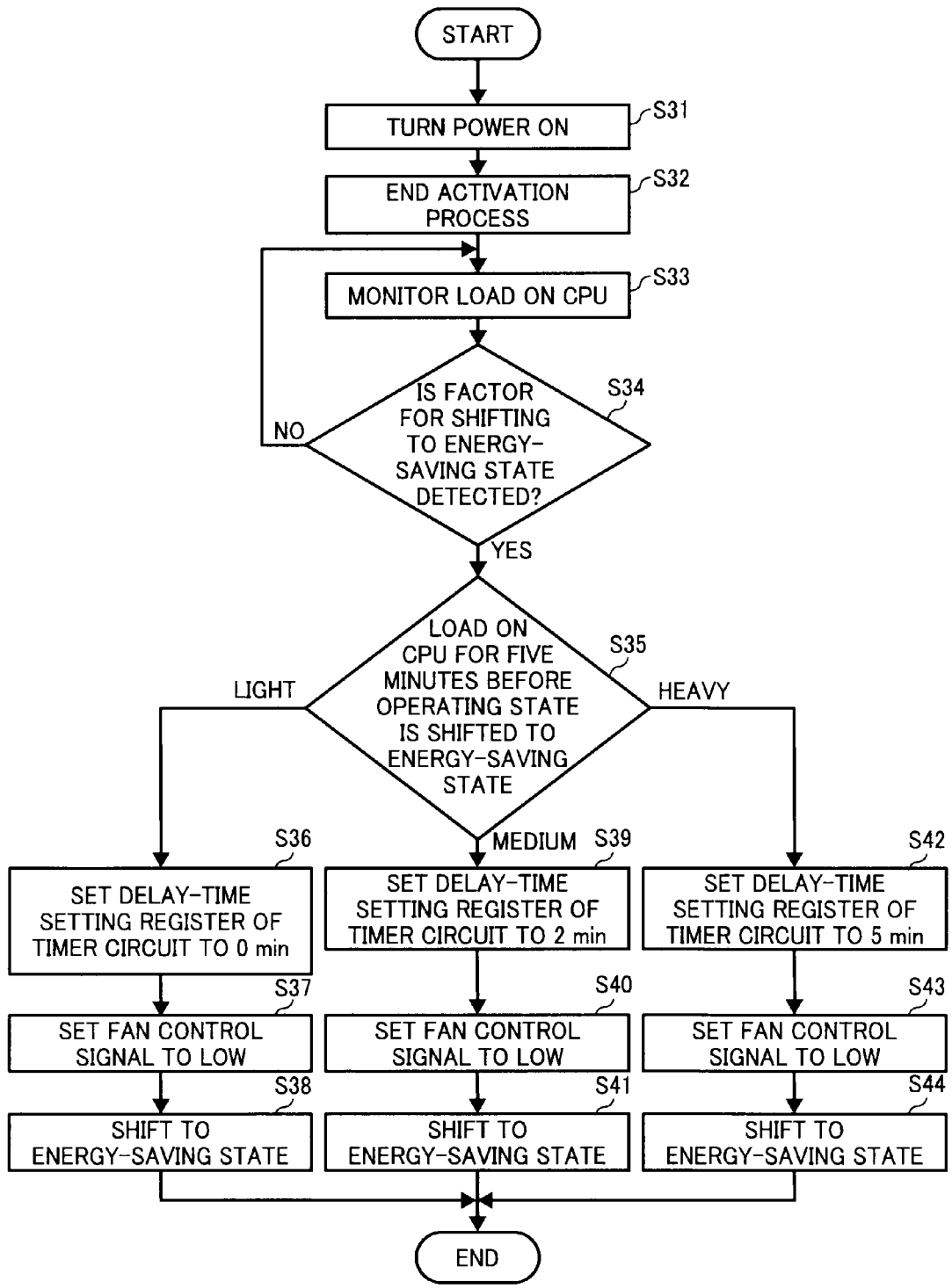
FIG. 12 is a flowchart for explaining operations performed by the image processing apparatus from turning on of the power source to switching to the energy-saving state according to the second embodiment.

FIG. 12 is a flowchart for explaining operations performed by the image processing apparatus from turning on of the power source to switching to the energy-saving state according to the second embodiment. When the power source of the image processing apparatus is turned on (Step S31), an activation process is performed. When the activation process ends (Step S32), the ASIC 102 monitors a load on the CPU 101 (Step S33). Specifically, the load on the CPU 101 is determined in the same manner as in the first embodiment.

Then, the ASIC 102 enters a wait state for detecting a factor for shifting to the energy-saving state (No at Step S34).

When a factor for shifting to the energy-saving state is detected (Yes at Step S34), the amount of load on the CPU 101 for five minutes before the operating state is shifted to the energy-saving state is determined (Step S35). If the amount of load on the CPU 101 is heavy for five minutes before the operating state is shifted to the energy-saving state, the delay-time setting register 1041 is set to five minutes of the delay time (Step S42). Then, the fan control signal is set to LOW (Step S43). The operating state is then shifted to the energy-saving state (Step S44). In this manner, the rotation of the CPU fan 107, the case fan 108, and the case fan 109 are continued for the delay time of five minutes after the operating state is shifted to the energy-saving state.

Figure 13A:
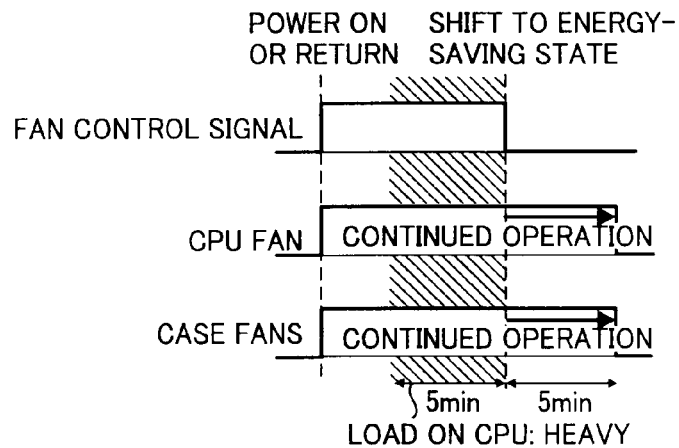
FIG. 13A is a timing chart for explaining a level of a fan control signal and rotating states of a CPU fan and case fans when the amount of load on the CPU is heavy just before the operating state is shifted to the energy-saving state in the image processing apparatus according to the second embodiment.

FIG. 13A is a timing chart for explaining a level of the fan control signal and the rotating states of the CPU fan 107, the case fan 108, and the case fan 109 when the amount of load on the CPU 101 is heavy just before the operating state is shifted to the energy-saving state. Before the operating state is shifted to the energy-saving state, the fan control signal is set to High, and therefore the control signal for supplying the power is input from the ASIC 102 to each of the CPU fan 107, the case fan 108, and the case fan 109. Thus, the CPU fan 107, the case fan 108, and the case fan 109 are rotated.

If the amount of load on the CPU 101 is heavy for five minutes before the operating state is shifted to the energy-saving state, it is assumed that the temperature of the CPU 101 is high. In such a case, all of the cooling fans including the CPU fan 107 are to be rotated by the fan-rotation maintaining unit 1040, and the delay time (the rotation continuing time) of five minutes is set in the delay circuit of each of the cooling fans so that the rotation of the cooling fans is continued in a relatively long time.

When the operating state is shifted to the energy-saving state, a trigger is input from the ASIC 102 to each of the delay circuits 121, 122, and 123 whereby the delay circuits 121, 122, and 123 are operated and the control signal for supplying the power is continuously input to each of the transistors 115, 116, and 117 for the set delay time. Therefore, the rotation of the cooling fans is continued.

As shown in FIG. 12, if the amount of load on the CPU 101 is medium (load medium 1, load medium 2 in FIG. 7) for five minutes before the operating state is shifted to the energy-saving state at Step S35, the delay-time setting register 1041 is set to two minutes of the delay time (Step S39). Then, the fan control signal is set to LOW (Step S40). The operating state is then shifted to the energy-saving state (Step S41). Thus, the rotation of the CPU fan 107, the case fan 108, and the case fan 109 are continued for the delay time of two minutes after the operating state is shifted to the energy-saving state.

Figure 13B:
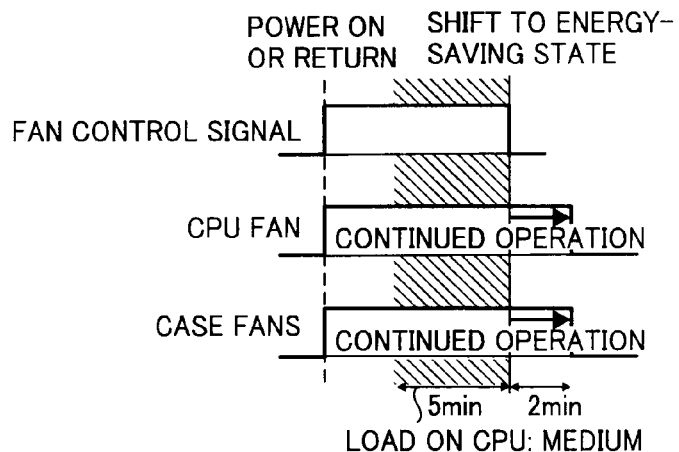
FIG. 13B is a timing chart for explaining a level of the fan control signal and the rotating states of the CPU fan and the case fans when the amount of load on the CPU is medium just before the operating state is shifted to the energy-saving state in the image processing apparatus according to the second embodiment.

FIG. 13B is a timing chart for explaining a level of the fan control signal and the rotating states of the CPU fan 107, the case fan 108, and the case fan 109 when the amount of load on the CPU 101 is medium just before the operating state is shifted to the energy-saving state. If the load on the CPU 101 is medium for five minutes before the operating state is shifted to the energy-saving state, the rotation continuation time of the cooling fan can be shorter than that when the load on the CPU 101 is heavy. Therefore, the delay time is set to two minutes.

As shown in FIG. 12, if the amount of load on the CPU 101 is light (load light 1, load light 2 in FIG. 7) for five minutes before the operating state is shifted to the energy-saving state at Step S35, the delay-time setting register 1041 is set to zero minutes of the delay time (Step S36). Then, the fan control signal is set to LOW (Step S37). The operating state is then shifted to the energy-saving state (Step S38). Thus, the rotation of the CPU fan 107, the case fan 108, and the case fan 109 are stopped immediately after the operating state is shifted to the energy-saving state.

Figure 13C:
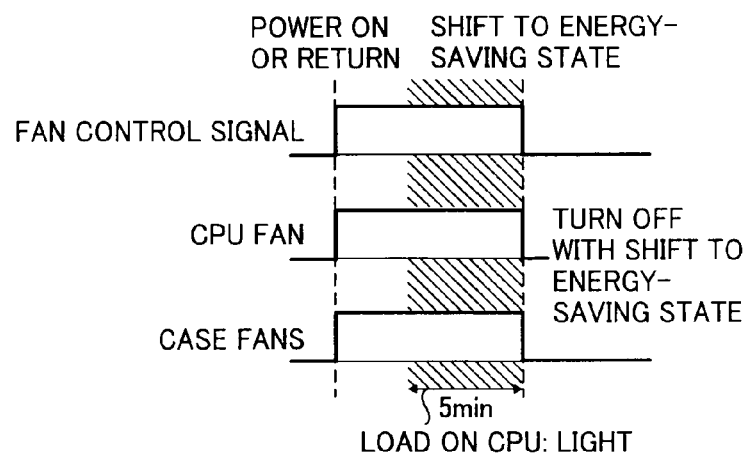
FIG. 13C is a timing chart for explaining a level of the fan control signal and the rotating states of the CPU fan and the case fans when the amount of load on the CPU is light just before the operating state is shifted to the energy-saving state in the image processing apparatus according to the second embodiment.

FIG. 13C is a timing chart for explaining a level of the fan control signal and the rotating states of the CPU fan 107, the case fan 108, and the case fan 109 when the amount of load on the CPU 101 is light just before the operating state is shifted to the energy-saving state. If the load on the CPU 101 is light for five minutes before the operating state is shifted to the energy-saving state, it is assumed that the temperature of the CPU 101 is low. Therefore, the rotation of all of the cooling fans is stopped at the same time the operating state is shifted to the energy-saving state.

It is explained above that the circuit shown in FIG. 10 is operated after the operating state is shifted to the energy-saving state. However, if turning on/off of the power to the cooling fans is controlled by the operation of the transistors 115, 116, and 117 via the ASIC 102 in the normal operation in which the main control unit can be operated, the delay circuits 121, 122, and 123 are not necessary during the normal operation. Therefore, each of the delay circuits 121, 122, and 123 needs to be disabled during the normal operation, and be enabled when the image processing apparatus is in the energy-saving state.

The values of the delay time described in the embodiments are only examples, and the present invention is not limited to those.

As described above, the rotation of the cooling fan is continued for the predetermined time after the operating state is shifted to the energy-saving state to prevent deterioration or thermal runaway of the device. Therefore, it is possible to operate the cooling fans in an appropriate manner without degrading the energy-saving efficiency.

Furthermore, the variation by which the rotation of each of the cooling fans is continued or stopped is selected based on the load on the CPU 101 for, for example, five minutes before the operating state is shifted to the energy-saving state, and if the rotation of the cooling fan is to be continued, the delay time is set in accordance with the load on the CPU 101. In this manner, it is possible to reduce noises caused by unnecessary operation of the cooling fan, and to appropriately operate the cooling fan to obtain required cooling capacity with the minimum power consumption.

The present invention can be applied to any apparatus that includes a heat-producing member that produces heat and a fan that cools the heat-producing member.

According to an aspect of the present invention, it is possible to operate the cooling fans in an appropriate manner without degrading the energy-saving efficiency.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image processing apparatus comprising:
    an image processing unit that processes an image;
    a main control unit that controls the image processing unit;
    a fan for cooling the main control unit;
    a fan control unit that controls rotation of the fan independently of the main control unit;
    an energy-saving control unit that controls power supply to the main control unit and the fan control unit, and causes an operating state of the image processing apparatus to be shifted to an energy-saving state by turning off power supply to the main control unit; and a fan-rotation maintaining unit that maintains power supply to the fan control unit for a predetermined time even after the operating state of the image processing apparatus shifts to the energy-saving state thereby maintaining rotation of the fan for the predetermined time.

2. The image processing apparatus according to claim 1, wherein the fan control unit controls power supply to the fan to control the rotation of the fan, and the fan-rotation maintaining unit includes a delay circuit that delays cutting of power supply to the fan control unit for the predetermined time thereby causing the fan control unit to maintain power supply to the fan for the predetermined time.

3. The image processing apparatus according to claim 2, wherein the delay circuit includes a one-shot timer integrated circuit, a capacitor having predetermined capacitance, and a resistor having predetermined resistance.

4. The image processing apparatus according to claim 3, wherein the main control unit includes a central processing unit, and the predetermined capacitance and the predetermined resistance are set based on a delay time corresponding to at least one of a type and an operation clock frequency of the central processing unit, the delay time being a time duration for which the fan control unit delays cutting of power supply to the fan.

5. The image processing apparatus according to claim 4, wherein the fan includes a first fan for cooling whole of the main control unit and a second fan for cooling only the central processing unit, the energy-saving control unit includes a monitoring unit that monitors a load on the central processing unit for a certain time before the operating state is shifted to the energy-saving state, and the fan-rotation maintaining unit selects at least one of the first fan and the second fan as a target fan based on the load and maintains rotation of the target fan for the predetermined time.

6. The image processing apparatus according to claim 2, wherein the delay circuit is a timer circuit that can variably set the predetermined time.

7. The image processing apparatus according to claim 6, wherein the main control unit includes a central processing unit, and the energy-saving control unit includes
a monitoring unit that monitors a load on the central processing unit for a certain time before the operating state is shifted to the energy-saving state; and
a setting unit that sets the predetermined time in the timer circuit based on the load.

8. The image processing apparatus according to claim 1, wherein the energy-saving control unit causes the rotation of the fan to be forcibly stopped after the operating state is shifted to the energy-saving state.

9. A fan control method to be performed by an image processing apparatus, the image processing apparatus including an image processing unit that processes an image;

a main control unit that controls the image processing unit, a fan for cooling the main control unit; and a fan control unit that controls rotation of the fan independently of the main control unit, wherein the fan control method comprising:

controlling power supply to the main control unit and the fan control unit, and causing an operating state of the image processing apparatus to be shifted to an energy-saving state by turning off power supply to the main control unit; and maintaining power supply to the fan control unit for a predetermined time even after the operating state of the image processing apparatus shifts to the energy-saving state thereby maintaining rotation of the fan for the predetermined time.

* * * * *